United States Patent
Ku et al.

(10) Patent No.: US 9,977,857 B1
(45) Date of Patent: May 22, 2018

(54) METHOD AND CIRCUIT FOR VIA PILLAR OPTIMIZATION

(71) Applicant: Taiwan Semiconductor Manufacturing Company, Ltd., Hsinchu (TW)

(72) Inventors: Chun-Yao Ku, Hsinchu (TW); Hung-Chih Ou, Kaohsiung (TW); Shao-Huan Wang, Taichung (TW); Wen-Hao Chen, Hsin-Chu (TW); Ming-Tao Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days. days.

(21) Appl. No.: 15/600,410

(22) Filed: May 19, 2017

(51) Int. Cl.
*H01L 21/82* (2006.01)
*G06F 17/50* (2006.01)
*H01L 23/522* (2006.01)

(52) U.S. Cl.
CPC ...... *G06F 17/5081* (2013.01); *G06F 17/5077* (2013.01); *H01L 23/5226* (2013.01)

(58) Field of Classification Search
CPC ............. H01L 23/5226; H01L 23/5228; H01L 31/02016; H01L 23/49827
USPC ........ 438/110, 128, 129, 637; 257/208, 211, 257/758
See application file for complete search history.

(56) References Cited

U.S. PATENT DOCUMENTS

| | | | |
|---|---|---|---|
| 7,013,438 B1* | 3/2006 | Saldanha | G06F 17/505 716/104 |
| 9,432,298 B1* | 8/2016 | Smith | H04L 49/9057 |
| 2016/0284631 A1* | 9/2016 | Cabahug | H01L 23/49531 |
| 2017/0018504 A1* | 1/2017 | Byun | H01L 23/5286 |
| 2017/0221429 A1* | 8/2017 | Kobayashi | G09G 3/3413 |
| 2017/0300806 A1* | 10/2017 | Lee | G06N 3/04 |

* cited by examiner

*Primary Examiner* — S. V. Clark
(74) *Attorney, Agent, or Firm* — Merchant & Gould P.C.

(57) ABSTRACT

In examples described herein, methods for via pillar placement and an integrated circuit design including a via pillar are described. In some instances, a path within an integrated circuit or proposed integrated circuit design can be identified as having negative slack. In such instances, in particular where the path includes a fanout to input pins of receivers, a via pillar can be inserted at a location prior to fanout of the path. The via pillar can be inserted, for example, proximate to the fanout, but between the fanout and an output pin of a driver that is connected to the path.

20 Claims, 6 Drawing Sheets

METHOD AND CIRCUIT FOR VIA PILLAR OPTIMIZATION

BACKGROUND

The present disclosure relates generally to designing a circuit for inclusion in a semiconductor device and, more particularly, to optimizing circuit performance using via pillars.

The process of manufacturing integrated circuits (ICs) include several stages, of which, the definition of a pattern associated with the circuit is of critical importance. The pattern may be generated during the design process, and in particular in a layout design. The pattern may then be fabricated on a substrate using photolithography processes.

There is significant pressure on the semiconductor industry to enable smaller and smaller critical dimensions of integrated circuits. At the same time, increased performance, in terms of lower power and/or faster timing capabilities, are desired as well. As critical dimensions of integrated circuits decrease, including widths of circuit paths between circuit elements, the resistance of such circuit paths increases, leading to potential problems such as increased power consumption and/or slower performance.

In designing integrated circuits, routing of interconnections between circuit elements can have a drastic effect on performance. In particular, as circuit features decrease in size, such routing can represent a not insignificant source of signal delay. In one particular example, resistance experienced at vias between conductive layers can increase delay in signal propagation between circuit elements; such resistance becomes more significant at smaller sizes and higher performance levels (lower voltage, higher frequence) that are increasingly desired.

Accordingly, improvements in design and layout of integrated circuits that improve timing of circuit layouts are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
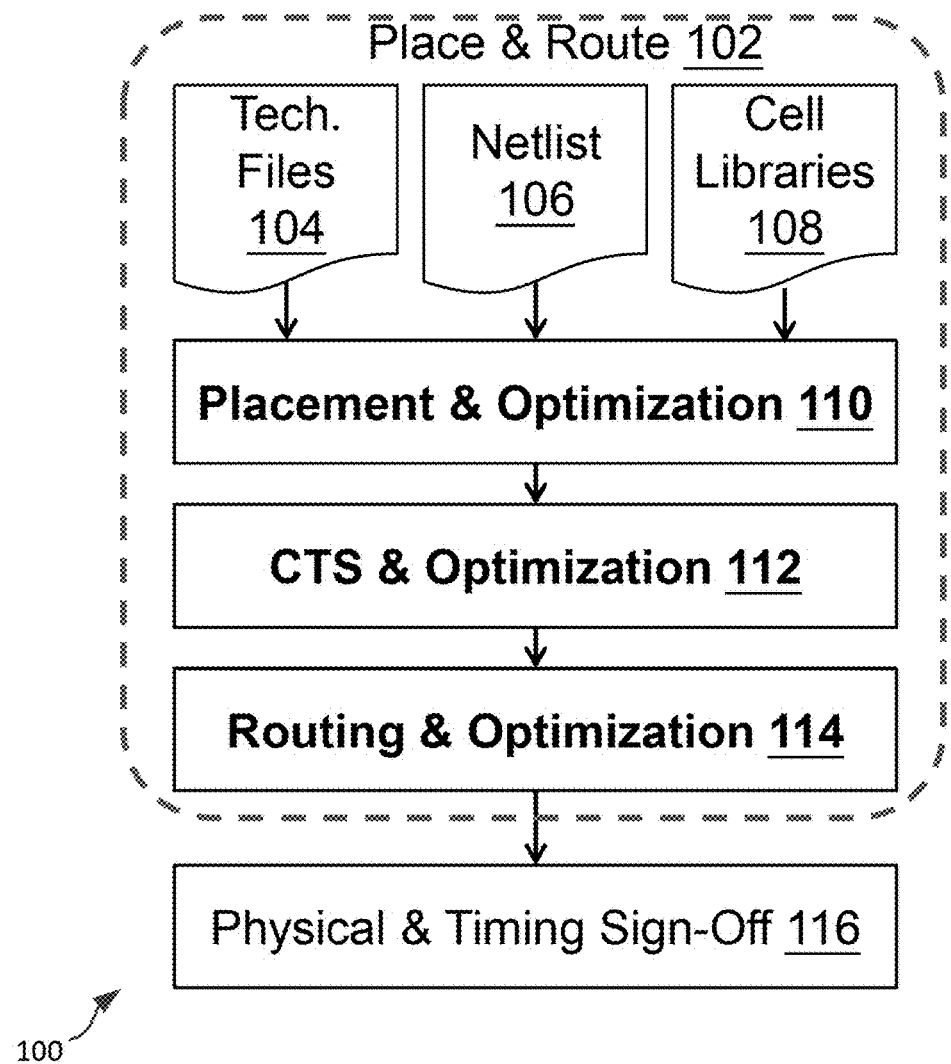
FIG. 1 illustrates an example method of performing an integrated circuit design process including placement and routing, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A via pillar, as that term is used herein, refers to use and arrangement of multiple vias in a parallel and symmetric fashion. Use of such a via pillar has increasingly been used to reduce wire delay by reducing a via resistance at an output pin of a circuit driver. This provides performance advantages with respect to timing, because the reduced resistance will likewise reduce wire delays that are introduced by routing. However, there is a trade-off that exists with respect to use of via pillars, since such structures require additional space within a semiconductor geometry, and therefore may make routing unnecessarily complex and limit the extent to which compactness of a circuit layout can be maintained.

Accordingly, in the context of the present disclosure, a methodology for selecting additional locations at which via pillars can be used is disclosed, as well as circuits including via pillars. In example embodiments, a via pillar can be selectively included prior to fanout leading to a plurality of input pins. This avoids unnecessary duplication of via pillars on each fanout track, while further reducing delay in the circuit beyond simply placing via pillars at only an output of a driver.

Referring to FIG. 1, a general process 100 for circuit design and optimization is illustrated, according to an example embodiment of the present disclosure. The general process 100 as depicted includes a place and route process 102, in example embodiments.

The place and route process 102 generally involves determining a location of and interconnection/routing between circuit components in designing a layout of an integrated circuit for fabrication. The place and route process 102 receives, in the embodiment shown, technology files 104, a netlist 106, and cell libraries 108, and routes each to a placement and optimization process 110. The technology files 104 can include information about the process with which the integrated circuit will be manufactured, for example including information about the materials and structures used to form circuit elements, which affect circuit timing simulations. The netlist 106 can include a definition of interconnections between circuit sub-elements, without definition of specific locations or routing paths between those circuit sub-elements. The cell libraries 108 can include pre-defined circuit cells that can be imported into the layout of the integrated circuit at various locations. Other types of information can be incorporated into the placement and optimization process 110.

During the placement and optimization process 110, the various circuit elements to be incorporated into the integrated circuit are placed in a proposed layout of an integrated circuit. In example embodiments, the placement and optimization process 110 can use resistance and capacitance values for an anticipated process (e.g., as determined from the technology files 104) to calculate a timing, assuming a shortest distance between two pins. The placement and optimization process 110 can be performed iteratively, for example to insert circuit elements to assist with timing concerns, perform sizing operations, or other optimizations. In example embodiments, during optimization within the placement and optimization process 110, one or more via pillars can be inserted into a proposed layout of an integrated circuit.

A clock tree synthesis (CTS) and optimization process 112 is also performed based on the placement of circuit elements. The CTS and optimization process 112 is performed, for example, to reduce skew and insertion delay that may be present based on the selected placement of circuit elements. Accordingly, the CTS and optimization process 112 manages timing among sub-circuits to ensure that signals are transmitted at appropriate timings. As with the placement and optimization process 110, during optimization within the CTS and optimization process 112, one or more via pillars can be inserted into a proposed layout of an integrated circuit, for example to accommodate skew relative to synchronous pins routed to a particular circuit receiver, e.g., to add or remove slack (time for signal arrival) to achieve a desired timing.

A routing and optimization process 114 determines routing paths between circuit objects within a proposed layout of a circuit. The routing portion of the routing and optimization process 114 connects paths between sub-circuit elements, with optimization corresponding to determining a best routing between such elements. In example embodiments the routing and optimization process 114 performs a global and detailed routing, by allocating resources for connections, and determining actual connections and paths to be established between circuit elements, and determining wire lengths, timings, and other associated performance characteristics of a particular possible routing layout. As above, with processes 110-112, one or more via pillars can be inserted into a proposed layout of an integrated circuit, for example to adjust for routing delay based on length of tracks, etc., to add or remove slack (time for signal arrival) to achieve a desired timing.

It is noted that in various embodiments, the processes 110-114 can be performed iteratively, for example to relocate or add circuit elements, or modify routing or clock tree synthesis, to accommodate a specific timing requirement. Accordingly, upon completion of the place and route process 102, a physical validation and timing sign-off process 116 may be performed to validate that each physical circuit is correctly included and sequenced, and that specific timing requirements needed to meet a predetermined performance threshold, e.g., as to timing requirements.

Figure 2:
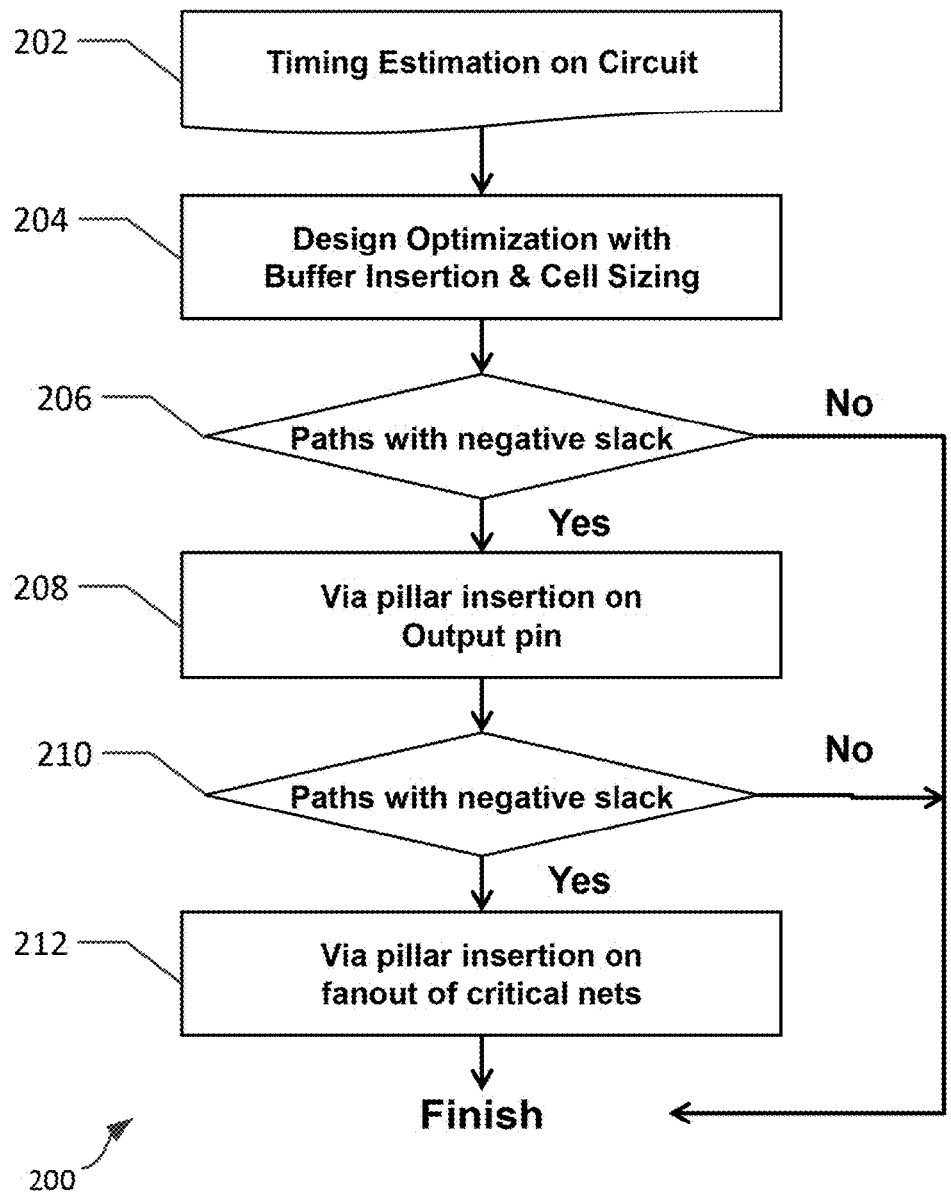
FIG. 2 illustrates an example optimization method useable during the integrated circuit design process of FIG. 1, in accordance with some embodiments.

Referring now to FIG. 2 an example optimization method 200 is shown that is useable during the integrated circuit design process of FIG. 1, in accordance with some embodiments. The optimization method 200 can be performed, for example, during optimization within each of the processes 110-114 of FIG. 1.

In the example shown, the method 200 includes performing a timing estimation on the circuit (step 202). The timing estimation can be a determination, for example, of whether any path, at a current state of placement/routing, has a negative slack characteristic. In other words, the timing estimation can determine whether any path within a proposed layout of a circuit exceeds a timing threshold, and therefore will not meet a defined, required performance characteristic.

In the example as shown, following the timing estimation, the method 200 includes performing a design optimization process (step 204). The design optimization process may include, for example, insertion of one or more buffers to address clock skew, sizing one or more subcircuit elements or relocating such elements, or modifying routing of paths between such elements, depending on the process being optimized, among processes 110-114.

A negative slack determination operation (operation 206) determines whether, in a current proposed layout of an integrated circuit, negative slack exists on any path. Negative slack refers, in the context of the present disclosure, to an amount of time by which a particular path fails to meet a timing requirement of the integrated circuit design. For example, if an integrated circuit is specified to operate at a particular frequency and therefore must reliably deliver electrical signals between circuit stages within a predetermined time, negative slack would refer to an amount of time by which the current proposed layout exceeds the predetermined time, and therefore would fail the timing and performance requirements of the integrated circuit.

If no paths exist with negative slack, operation 206 causes branching "no" to indicate completion of the optimization method 200, since no further optimization is required. However, if paths with negative slack exist, operation 206 causes branching "yes" to a output pin via pillar insertion operation (step 208). During the output pin via pillar insertion operation, a via pillar is inserted on an output pin of a driver and along a path having negative slack. This will cause reduction of resistance along the path, and improve timing of the circuit along that path, as discussed in further detail below.

A second negative slack determination operation (operation 210) determines whether, after insertion of via pillars on any output pins from drivers on paths with negative slack, there remain any paths having negative slack. If no such paths remain, operation 210 causes branching "no" to indicate completion of the optimization method 200, since no further optimization is required. However, if paths with negative slack exist, operation 210 causes branching "yes" to a second via pillar insertion process (step 212). During the second via pillar insertion process, one or more via pillars can be inserted, rather than at an output pin from a driver, closer to an input pin of a receiver along the path. Such negative slack may exist because, although via pillar on output pin will reduce via resistance at the driver side, the receiver side still suffers large via resistance, and therefore will be a source of delay.

By only inserting via pillars on critical paths having negative slack, and in particular those paths for which via pillars are already attempted to be inserted at the output pin, resistance along such critical paths can be reduced and timing improved. Insertion of such via pillars has a cost of increased routing resources, but the extent of such an increase can be limited in a number of ways. In particular, by only inserting such via pillars on critical paths for which "output-side" via pillars is not adequate by itself to meet timing requirements, the number of "input-side" via pillars is reduced. Furthermore, and as further noted below, to reduce the routing resources required, in some embodiments, such "input-side" via pillars can be inserted prior to fanout of a path to a plurality of input pins associated with receivers of sub-circuit elements, which avoids the requirement of replicating via pillars at each such input pin, while obtaining the benefit of reduced resistance along the path.

Referring now to FIGS. 3-6, specific details regarding layout and advantages of inserting via pillars at various locations along paths between circuit components are described. In particular, via pillars may be inserted along a routing path between two circuit elements. As illustrated in a first circuit 300 shown in FIG. 3, a path 306 may be defined between a driver 302 and a receiver 304, with an output pin of the driver 302 connected to the path, which in turn connects to an input pin of receiver 304.

To establish the path 306 between the driver 302 and receiver 304, it may be that vias may be required to connect between a layer at which those circuit elements are included, and a routing layer of an integrated circuit. In the example shown, a plurality of conductive layers are illustrated, shown as layers M2-M6. It is assumed, in the embodiment shown, that layer M2 is electrically connected to the driver 302 and receiver 304, with layer M6 acting as a routing layer.

As seen in the circuit 300, a via pillar 308 is established at the output pin of the driver 302. The via pillar 308, in the present embodiment, is depicted as parallel tracks and connecting vias at layers M3, M4, and M5, with each set of parallel tracks at each conductive layer being perpendicular to the parallel tracks of an adjacent routing layer. The via pillar 308 increases an amount of routing resource at a location likely to contribute a greatest resistance component to the path 306, and therefore reduces resistance at that location, leading to improved timing and faster signal propagation. Using one example manufacturing process, and for purposes of comparison to other routing variants described herein, the arrangement of FIG. 3 experiences a 1.0 unit normalized resistance at the output pin of the driver 302, and a 3.67 total unit resistance at the input pin of the receiver, leading to a total resistance of 4.67 units.

Figure 3:
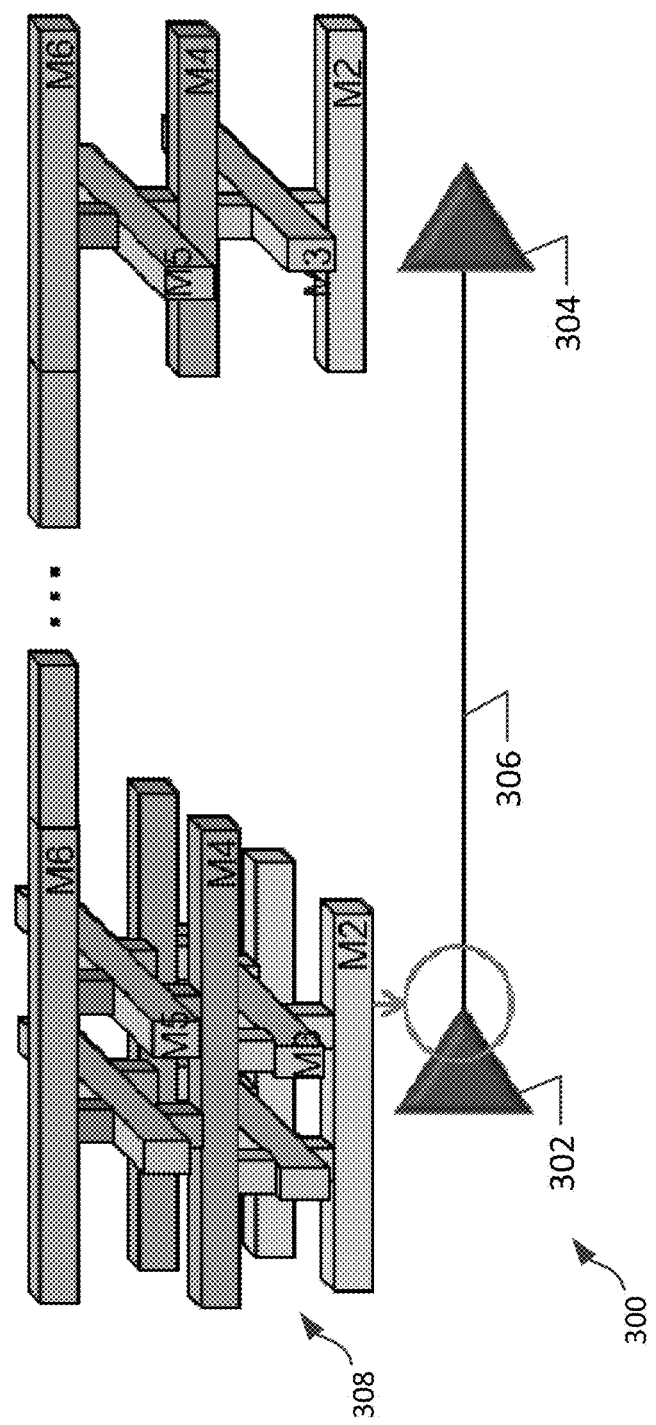
FIG. 3 illustrates a portion of a circuit in which a via pillar is placed at an output pin of a driver and along a circuit path, in accordance with some embodiments.
Figure 4:
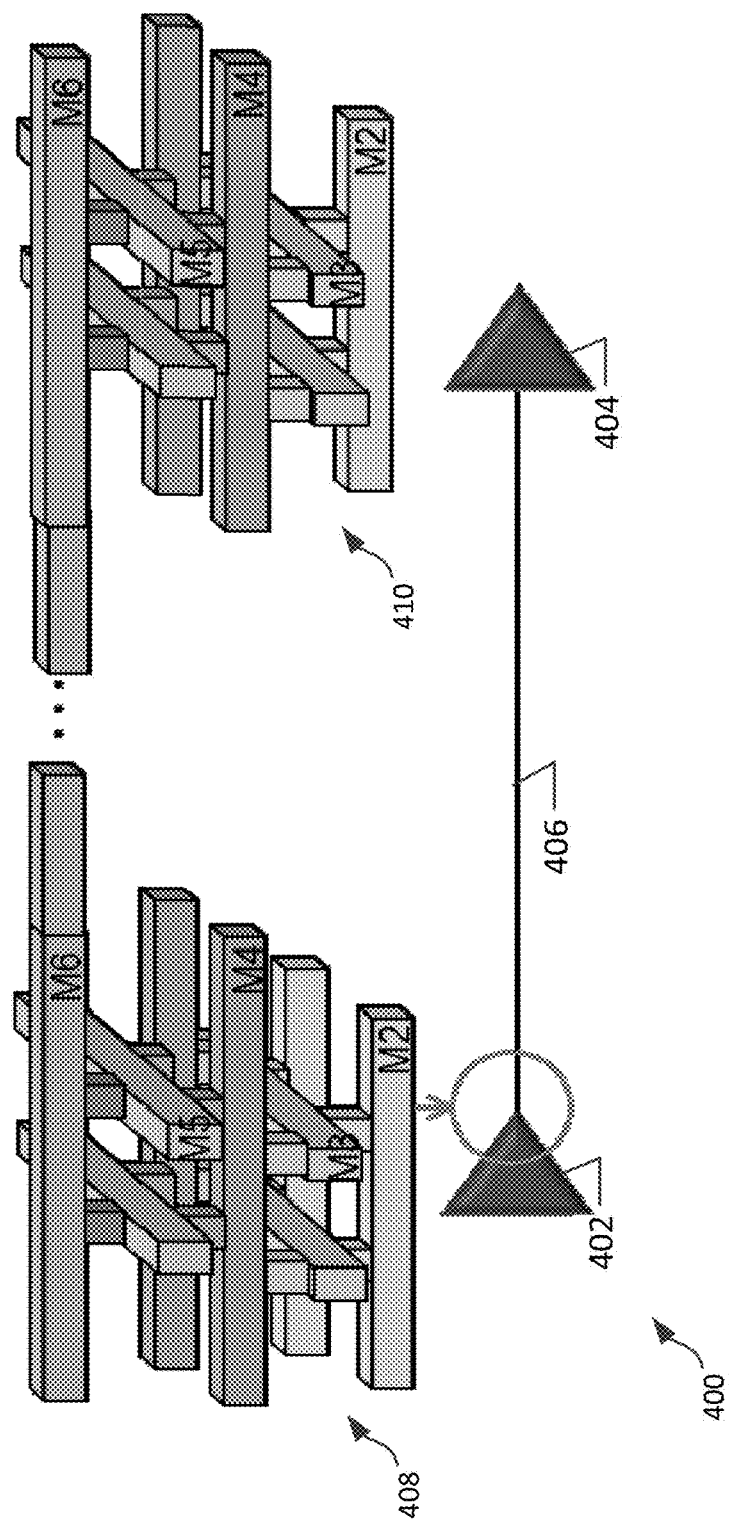
FIG. 4 illustrates a portion of a circuit in which a first via pillar is placed at an output pin of a driver and along a circuit path, and a second via pillar is placed at an input pin of a receiver and along the circuit path, in accordance with some embodiments.

By way of comparison, FIG. 4 illustrates a circuit 400 in which a driver 402 and receiver 404 are connected via a path 406 along which via pillars 408, 410 are inserted at an output pin of the driver 402 and an input pin of the receiver 404, respectively. In this example, the via pillars 408, 410 each provide parallel tracks and associated vias at circuit layers M2-M5. Accordingly, in this example, the circuit 400 experiences a normalized unit resistance at the output pin of the driver 302, and a normalized single unit resistance at the input pin of the receiver, leading to a 2.0 unit resistance total resistance, thereby further improving timing characteristics relative to the circuit 300 of FIG. 3.

Although in the example shown the via pillars 408, 410 are constructed similarly in terms of a number of layers and routing resources at each layer, it is noted that via pillars at output pins and input pins may be constructed differently, for example one such via pillar could have more than two parallel tracks to further reduce resistance, or may have more or fewer layers by way of comparison (with a corresponding effect on resistance).

Referring to FIGS. 3-4 generally, specific resistances at each via layer can be calculated based on a type of via included. As seen in Table 1, below, via resistances can be calculated by aggregating the resistances of vias at each layer. The use of via pillars, as seen in Table 1, results in substantially lower resistance at a particular via, leading to improved performance:

TABLE 1

| Via Resistance Comparison of Via Pillars | | |
| --- | --- | --- |
| Layer | Single via stacking resistance (normalized to single VIA1 resistance) | Via pillar stacking resistance (normalized to single VIA1 resistance) |
| VIA1 | 1.00 | 0.25 |
| VIA2 | 1.14 | 0.29 |
| VIA3 | 0.86 | 0.21 |
| VIA4 | 0.29 | 0.07 |
| VIA5 | 0.29 | 0.14 |
| Total | 3.57 | 0.96 |

It is noted that, although use of via pillars at both output pins and input pins have advantages with respect to lowered resistance, inclusion of via pillars at each output pin of a driver and input pin of a receiver is not feasible due to the increased routing requirements of using such features at each location. Accordingly, the methodology described above in connection with FIGS. 1-2 may be used to establish locations where via pillars might be used at each location, with via pillars adjacent to output pins of drivers first included on paths having negative slack, and subsequently selectively adding via pillars adjacent to input pins of receivers, where the receiver side resistance results in negative slack.

Figure 5:
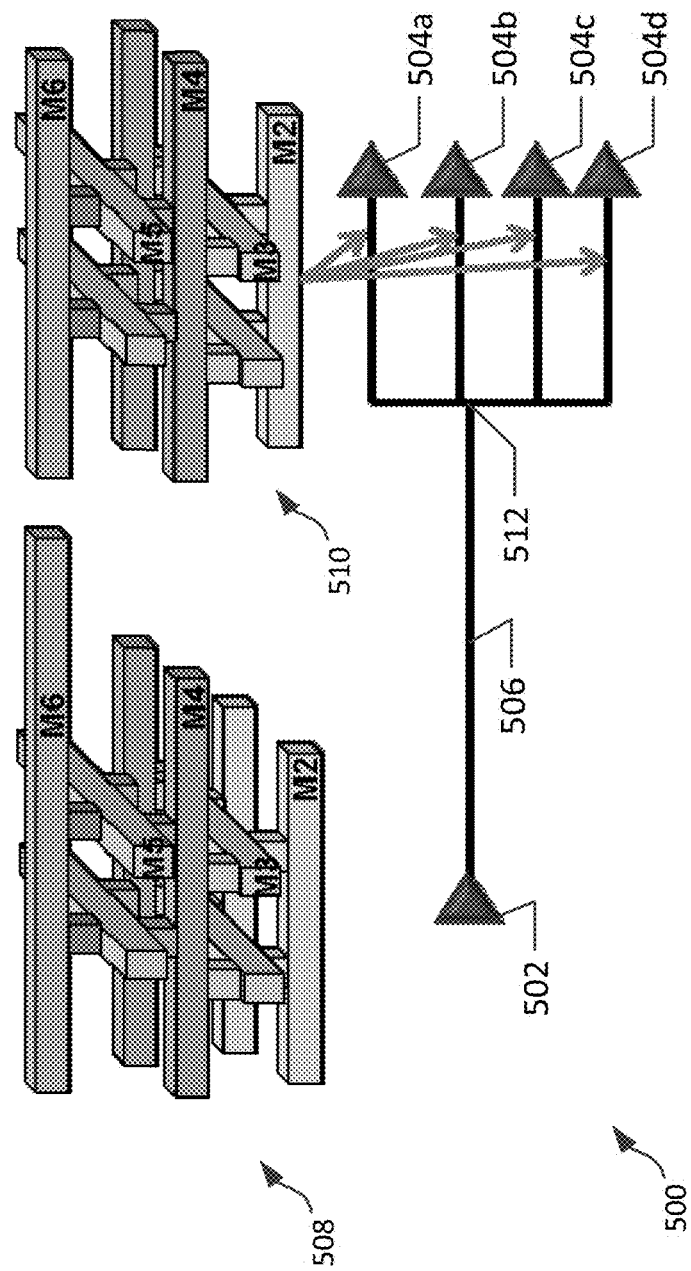
FIG. 5 illustrates a portion of a circuit in which via pillars are placed at input pins of receivers included in a circuit path, in accordance with some embodiments.
Figure 6:
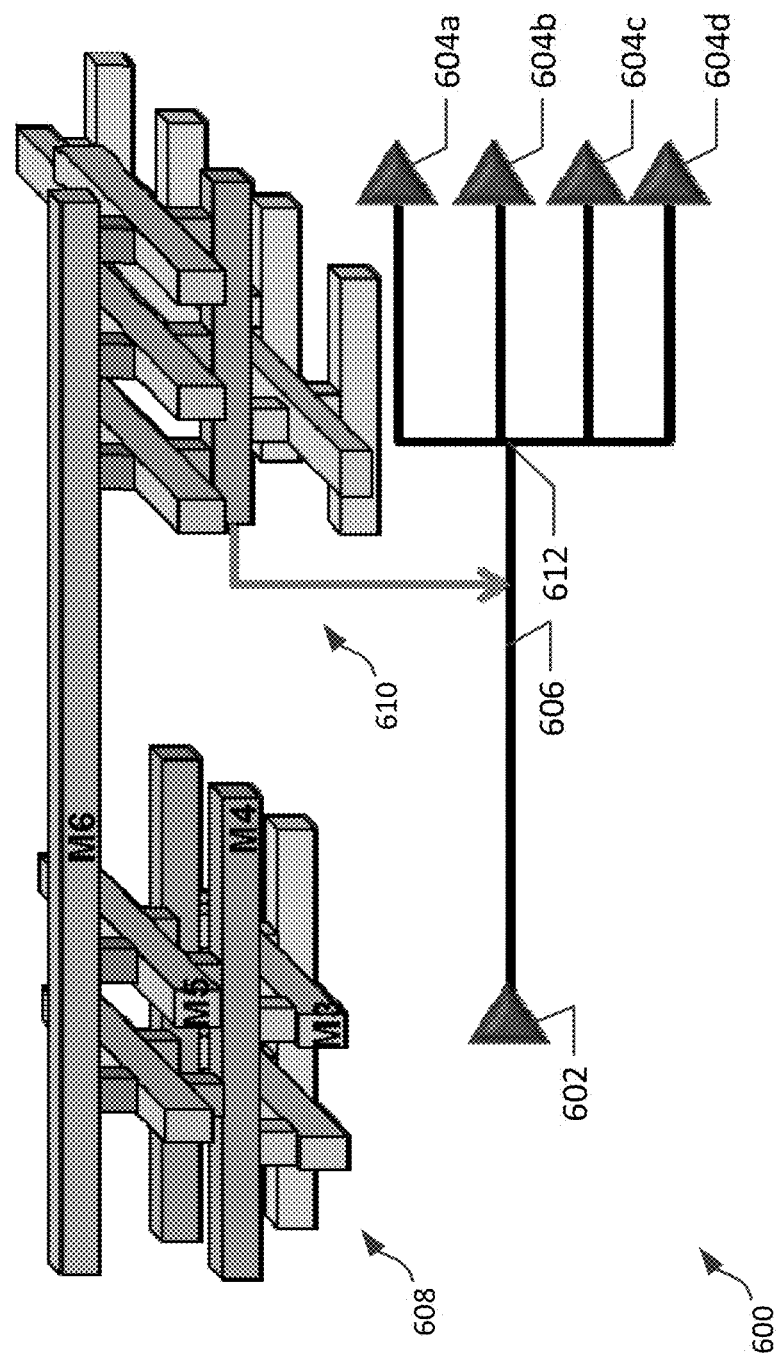
FIG. 6 illustrates a portion of a circuit in which a via pillar is placed along a circuit path proximate to and prior to a fanout to input pins of receiver, between an output pin and the fanout, in accordance with some embodiments.

Referring now to FIGS. 5-6, additional optimizations regarding insertion of via pillars within an integrated circuit are discussed. In particular, advantages of locating a via pillar prior to fanout of a path to input receivers are discussed, in particular relative to conservation of routing resources. As noted below, where a via pillar could be included adjacent to input pins of receivers during an optimization process as described above, such a via pillar could obtain equivalent benefits but not require substantial replication of routing resources by placing the via pillar adjacent to but prior to fanout of the path leading to the plural input pins.

Referring first to FIG. 5 by way of comparison, a circuit 500 is shown in which a driver 502 connects to a plurality of receivers 504a-d via a path 506. The path 506 includes a fanout location 512.

In the example shown, the circuit 500 includes via pillars 508, 510. Although via pillar 508 is connected to the output pin of the driver 502, a separate via pillar 510 is included at each input pin of receivers 504a-d. Therefore, in this example circuit 500, a separate set of parallel tracks at each of layers M3-M5 are included.

As seen in Table 2, below, although the use of via pillars at both an output pin of a driver and an input pin of a receiver, as seen in FIG. 4, may be a reasonable design approach in the case fanout is not high in the path, where fanout is increased (e.g., to a fanout of 4, or 24, for example) the number of tracks in each of the conductive layers M2-M6 drastically increases, leading to use of a large number of routing resources and increasing routing complexity. Accordingly, as seen in Table 2, use of a via pillar immediately adjacent to an input pin may be possible, but may have a substantial resource usage penalty so as to be inadvisable:

TABLE 2

Routing Resources By Number of Fanouts in Path

| Via pillar Usage | # of Fanouts | M2 Tracks | M3 Tracks | M4 Tracks | M5 Tracks | M6 Tracks | Total Tracks Occupied |
|---|---|---|---|---|---|---|---|
| Apply at output | 1 | N + 1 | N + 1 | N + 1 | N + 1 | 1 | 4N + 5 |
| Apply at output & input | 1 | 2N | 2N | 2N | 2N | 1 | 8N + 1 |
| Apply at output & input | 4 | 5N | 5N | 5N | 5N | 1 | 20N + 1 |
| Apply at output & input | 24 | 24N | 24N | 24N | 24N | 1 | 96N + 1 |

By way of comparison, in FIG. 6, a circuit 600 is illustrated in which a driver 602 connects to receivers 604a-d via a path 606 having a fanout. In this example, via pillars 608, 610 are included. While via pillar 608 is located and structured equivalently to via pillar 508 of FIG. 5, via pillar 610 is located adjacent, but prior to, fanout 612. In other words, the via pillar 610 is adjacent to fanout 612, but is located between the fanout 612 and the output pin of the driver 602, rather than between the fanout 612 and each input pin of receivers 604a-d.

In the example of FIG. 6, the circuit 600 can be implemented to reduce the number of routing resources used, while still allowing for application of a via pillar proximate to input pins of receivers along a circuit path. Table 3 illustrates a comparison between the via pillar applications in FIGS. 5 and 6 in terms of routing resources in the case of a high-fanout path:

TABLE 3

Resource Usage Comparison for Via Pillar Usage Prior to Fanout

| Via pillar Usage | # of Fanouts | M2 Tracks | M3 Tracks | M4 Tracks | M5 Tracks | M6 Tracks | Total Tracks |
|---|---|---|---|---|---|---|---|
| Apply at input | 1 | 2N | 2N | 2N | 2N | 1 | N + 1 |
| Apply at input | 24 | 24N | 24N | 24N | 24N | 1 | 96N + 1 |
| Apply prior to fan-out | 24 | 2N | 2N | 2N | 2N | 1 | 8N + 1 |

In particular, where the fanout is 1 (i.e., no fanout), in both cases, the total number of tracks required to apply a via pillar at the input pin is 8N+1, where N is the number of tracks to which a via pillar must be applied for timing optimization purposes. However, where fanout is much higher (e.g., 24-track fanout, as illustrated in Table 3), in the case of application of a via pillar directly at each input pin, 24 tracks are used at each metal layer, leading to use of 96N+1 tracks in total. By way of comparison, by applying the via pillar adjacent to, but immediately prior to a fanout, the via pillar can use the same amount of routing resources as if fanout is 1 (i.e., 8N+1). Accordingly, no matter the extent of fanout, by locating the via pillar prior to fanout, advantages of decreased via resistance are achieved without a corresponding requirement that large numbers of routing resources be used. In other words, track occupation does not inflate according to the number of fanouts.

Referring to FIGS. 1-6 overall, it is noted that placement of via pillars at the output pins of drivers, and at input pins of receivers (or in the case of fanout, immediately prior to fanout), can be performed at various times during a place and route process 102, for example in each instance where optimization is advisable (e.g., in processes 110-114). Use of such via pillars achieves improved performance by reducing resistance at both the output pin of a driver and input pin of a receiver, while avoiding excessive usage of routing resources in the case of high-fanout paths, which might degrade design performance and increase circuit complexity.

In accordance with the above, in one example embodiment, a method of optimizing via pillar placement in an integrated circuit is disclosed. The method can include, in such an example, identifying whether one or more paths within a proposed layout of an integrated circuit has a negative slack. Based on identification of at least one path within the proposed layout of the integrated circuit as having negative slack, the method includes placing a via pillar on an output pin of a driver associated with the at least one path. After placing a via pillar on an output pin of a driver associated with the at least one path, it is determined whether any of the one or more paths within the integrated circuit has negative slack, and, based on an identification of one or more paths within the integrated circuit having negative slack, inserting a via pillar at a location leading to an input pin to an associated receiver.

In a second example embodiment, a method of identifying a location for via pillar placement in an integrated circuit is disclosed. The method includes determining, whether any paths within a proposed layout of an integrated circuit has negative slack. Based on an identification of a path within the integrated circuit having negative slack, the method can include inserting a via pillar at a location prior to fanout of the path to a plurality of input pins leading to a corresponding plurality of receivers associated receiver.

In a third example embodiment, a circuit includes a circuit path extending between an output of a driver and a plurality of input pins leading to receivers, the circuit path including a fanout. The circuit includes a via pillar located between the output of the driver and the fanout, proximate to the fanout.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of optimizing via pillar placement in an integrated circuit, the method comprising:
   identifying whether one or more paths within a proposed layout of an integrated circuit has a negative slack;
   based on identification of at least one path within the proposed layout of the integrated circuit as having negative slack, placing a via pillar on an output pin of a driver associated with the at least one path;
   determining, after placing the via pillar on an output pin of a driver associated with the at least one path, whether any of the one or more paths within the integrated circuit has negative slack;
   based on an identification of one or more paths within the integrated circuit having negative slack, inserting a via pillar at a location leading to an input pin to an associated receiver.

2. The method of claim 1, wherein identifying whether one or more paths within the proposed layout of the integrated circuit has a negative slack includes performing a timing estimate on the proposed layout of the integrated circuit.

3. The method of claim 2, further comprising, after performing the timing estimate, performing a design optimization on a proposed layout of the integrated circuit.

4. The method of claim 1, wherein the location comprises a location leading to a plurality of input pins to a corresponding plurality of receivers.

5. The method of claim 4, wherein the location comprises a location prior to fanout of a track leading to the plurality of input pins.

6. The method of claim 1, further comprising, after inserting the via pillar at the location leading to the input pin to the associated receiver, validating that the one or more paths no longer have negative slack.

7. The method of claim 1, wherein determining whether any of the one or more paths within the proposed layout of the integrated circuit has negative slack includes determining whether any of the one or more paths does not meet a timing requirement for performance at a predetermined threshold.

8. A method of identifying a location for via pillar placement in an integrated circuit, the method comprising:
   determining, whether any paths within a proposed layout of an integrated circuit has negative slack;
   based on an identification of a path within the integrated circuit as having negative slack, inserting a via pillar at a location proximate to and prior to fanout of the path to a plurality of input pins leading to a corresponding plurality of receivers associated receiver.

9. The method of claim 8, further comprising performing a timing estimation on a proposed layout of the integrated circuit.

10. The method of claim 9, further comprising performing a design optimization on the proposed layout of the integrated circuit.

11. The method of claim 10, wherein the design optimization includes buffer insertion and cell sizing.

12. The method of claim 11, further comprising performing an initial determination of whether any paths within the proposed layout of the integrated circuit have negative slack.

13. The method of claim 12, further comprising, in response to determining that one or more paths within the proposed layout of the integrated circuit have negative slack during the initial determination, inserting a via pillar at the output pin of a driver, the output pin electrically connected to the path.

14. The method of claim 8, further comprising, after inserting the via pillar, confirming that the path does not have negative slack.

15. The method of claim 14, further comprising approving a physical layout of the integrated circuit.

16. A circuit comprising:
   a circuit path extending between an output of a driver and a plurality of input pins leading to receivers, the circuit path including a fanout; and
   a via pillar located between the output of the driver and the fanout, the via pillar being located proximate to the fanout.

17. The circuit of claim 16, further comprising a second via pillar at the output of the driver leading to the circuit path, the second via pillar electrically connected along the path to the via pillar.

18. The circuit of claim 16, wherein the via pillar includes a plurality of tracks including two or more tracks in each of a plurality of layers, the plurality of tracks being electrically interconnected.

19. The circuit of claim 16, wherein the plurality of input pins are located at a first layer of the integrated circuit and a track electrically connecting between the output pin of the driver and the via pillar is located at a second layer, and wherein the via pillar includes a plurality of tracks including two or more parallel tracks at each intervening layer between the first layer and the second layer.

20. The circuit of claim 16, wherein the via pillar is immediately adjacent to the fanout.

* * * * *

UNITED STATES PATENT AND TRADEMARK OFFICE
CERTIFICATE OF CORRECTION

| | |
|---|---|
| PATENT NO. | : 9,977,857 B1 |
| APPLICATION NO. | : 15/600410 |
| DATED | : May 22, 2018 |
| INVENTOR(S) | : Ku et al. |

It is certified that error appears in the above-identified patent and that said Letters Patent is hereby corrected as shown below:

In the Specification

Columns 7-8, Table 3, Under Total Tracks column: "N+1" should read --8N+1--

Signed and Sealed this
Twenty-fifth Day of December, 2018

Andrei Iancu
*Director of the United States Patent and Trademark Office*